(12) United States Patent
Hsu

(10) Patent No.: US 10,333,539 B2
(45) Date of Patent: Jun. 25, 2019

(54) ANALOG-TO-DIGITAL CONVERTER AND CALIBRATION METHOD THEREOF AND CALIBRATION APPARATUS

(71) Applicant: Jun-Hong Hsu, Tainan (TW)

(72) Inventor: Jun-Hong Hsu, Tainan (TW)

(73) Assignee: ITE Tech. Inc., Hsinchu (TW)

( * ) Notice: Subject to any disclaimer, the term of this patent is extended or adjusted under 35 U.S.C. 154(b) by 0 days.

(21) Appl. No.: 16/046,977

(22) Filed: Jul. 26, 2018

(65) Prior Publication Data
US 2019/0131991 A1 May 2, 2019

(30) Foreign Application Priority Data
Oct. 31, 2017 (TW) .............................. 106137537 A

(51) Int. Cl.
H03M 1/06 (2006.01)
H03M 1/10 (2006.01)

(52) U.S. Cl.
CPC ....... H03M 1/1023 (2013.01); H03M 1/0607 (2013.01)

(58) Field of Classification Search
CPC ........................ H01M 1/1023; H01M 1/0607
USPC ......................................... 341/118, 120, 155
See application file for complete search history.

(56) References Cited

U.S. PATENT DOCUMENTS

| | | | |
|---|---|---|---|
| 4,399,426 A * | 8/1983 | Tan ....................... | H03M 1/183 341/120 |
| 5,684,487 A * | 11/1997 | Timko ................ | H03M 1/1047 341/120 |
| 5,990,814 A * | 11/1999 | Croman ................ | H03K 5/2481 341/118 |
| 6,288,664 B1 * | 9/2001 | Swanson ............... | H03M 1/185 341/139 |
| 6,414,619 B1 * | 7/2002 | Swanson ............... | H03M 1/185 341/139 |

(Continued)

FOREIGN PATENT DOCUMENTS

| TW | 201310918 | 3/2013 |
|---|---|---|
| TW | 201427286 | 7/2014 |

OTHER PUBLICATIONS

"Office Action of Taiwan Counterpart Application", dated Aug. 14, 2018, p. 1-p. 6.

*Primary Examiner* — Lam T Mai
(74) *Attorney, Agent, or Firm* — JCIPRNET

(57) ABSTRACT

A calibration method includes the following: providing a first charge quantity to a first input terminal of a comparator; providing a second charge quantity to a second input terminal of the comparator by one of multiple switch capacitor groups, and providing a compensation charge quantity to the second input terminal of the comparator by at least another one of the switch capacitor groups; comparing a voltage value received by the first input terminal and a voltage value received by the second input terminal, and outputting a voltage comparison result to a controller; and if the controller determines the charge quantity provided to the second input terminal approximates to the charge quantity provided to the first input terminal based on the voltage comparison result, recording a calibration charge quantity in a lookup table stored by the controller. An analog-to-digital converter and a calibration apparatus are also provided.

20 Claims, 9 Drawing Sheets

(56) References Cited

U.S. PATENT DOCUMENTS

| | | | |
|---|---|---|---|
| 6,490,332 B1* | 12/2002 | Somayajula | G11C 19/00 377/54 |
| 6,538,594 B1* | 3/2003 | Somayajula | H03M 1/1023 341/120 |
| 6,559,789 B1* | 5/2003 | Somayajula | H03M 1/462 341/155 |
| 6,590,517 B1* | 7/2003 | Swanson | H03M 1/185 341/139 |
| 8,896,478 B2 | 11/2014 | Tsai et al. | |
| 8,994,564 B2* | 3/2015 | Hurrell | G11C 27/02 341/122 |
| 9,602,119 B1* | 3/2017 | Maulik | H03M 1/1014 |
| 9,698,804 B1* | 7/2017 | Funato | H03M 1/1023 |
| 2004/0246153 A1* | 12/2004 | Leung | H03M 1/1057 341/120 |

* cited by examiner

US 10,333,539 B2

ANALOG-TO-DIGITAL CONVERTER AND CALIBRATION METHOD THEREOF AND CALIBRATION APPARATUS

CROSS-REFERENCE TO RELATED APPLICATION

This application claims the priority benefit of Taiwan application serial no. 106137537, filed on Oct. 31, 2017. The entirety of the above-mentioned patent application is hereby incorporated by reference herein and made a part of this specification.

BACKGROUND OF THE INVENTION

Field of the Invention

The invention relates to a calibration technology and more particularly relates to an analog-to-digital converter, a calibration method thereof, and a calibration apparatus.

Description of Related Art

In the field of analog-to-digital converters (ADC), successive approximation register (SAR) analog-to-digital converters have advantages, such as smaller used unit area and lower power consumption, and therefore are widely used in various types of electronic apparatuses. However, the traditional SAR analog-to-digital converters often have capacitance mismatch, which affects the resolution of the analog-to-digital converters. The existing capacitance calibration method would increase the production costs or require more time for capacitance compensation and lower the performance of analog-to-digital converters. Some exemplary embodiments of the invention are provided below.

SUMMARY OF THE INVENTION

The invention provides an analog-to-digital converter, a calibration method, and a calibration apparatus that are capable of effectively calibrating capacitance mismatch and are convenient to use and involve lower costs.

A calibration method of the invention is adapted for an analog-to-digital converter. The analog-to-digital converter includes a controller, a comparator, and a switch capacitor array. The switch capacitor array includes a plurality of switch capacitor groups. The calibration method includes: providing a first charge quantity to a first input terminal of the comparator; providing a second charge quantity to a second input terminal of the comparator by one of the switch capacitor groups, and providing a compensation charge quantity to the second input terminal of the comparator by at least another one of the switch capacitor groups; comparing a voltage value received by the first input terminal and a voltage value received by the second input terminal by the comparator, and outputting a voltage comparison result to the controller; and if the controller determines that a charge quantity provided to the second input terminal approximates to a charge quantity provided to the first input terminal based on the voltage comparison result, recording a calibration charge quantity in a lookup table stored by the controller, wherein the calibration charge quantity is equal to the compensation charge quantity minus or plus a charge quantity provided by a unit capacitance.

An analog-to-digital converter of the invention includes a controller, a comparator, and a switch capacitor array. The comparator has a first input terminal, a second input terminal, and an output terminal. The comparator is coupled to the controller. The switch capacitor array is coupled to the controller. The switch capacitor array includes a plurality of switch capacitor groups. The first input terminal of the comparator receives a first charge quantity. The controller operates the switch capacitor groups, so as to provide a second charge quantity to the second input terminal of the comparator by one of the switch capacitor groups and provide a compensation charge quantity to the second input terminal of the comparator by at least another one of the switch capacitor groups. The comparator compares a voltage value received by the first input terminal and a voltage value received by the second input terminal, and outputs a voltage comparison result to the controller. If the controller determines that a charge quantity provided to the second input terminal approximates to a charge quantity provided to the first input terminal based on the voltage comparison result, the controller records a calibration charge quantity in a lookup table stored by the controller. The calibration charge quantity is equal to the compensation charge quantity minus or plus a charge quantity provided by a unit capacitance.

A calibration apparatus of the invention is adapted for calibrating an analog-to-digital converter. The analog-to-digital converter includes a controller, a comparator, and a switch capacitor array. The switch capacitor array includes a plurality of switch capacitor groups. The calibration apparatus includes a processor. The processor is coupled to the analog-to-digital converter. The processor is configured to drive the controller to execute a calibration operation, such that a first input terminal of the comparator receives a first charge quantity. The controller operates the switch capacitor groups, so as to provide a second charge quantity to the second input terminal of the comparator by one of the switch capacitor groups and provide a compensation charge quantity to the second input terminal of the comparator by at least another one of the switch capacitor groups. The comparator compares a voltage value received by the first input terminal and a voltage value received by the second input terminal, and outputs a voltage comparison result to the controller. If the controller determines that a charge quantity provided to the second input terminal approximates to a charge quantity provided to the first input terminal based on the voltage comparison result, the controller records a calibration charge quantity in a lookup table stored by the controller. The calibration charge quantity is equal to the compensation charge quantity minus or plus a charge quantity provided by a unit capacitance.

Based on the above, the analog-to-digital converter, the calibration method, and the calibration apparatus according to the embodiments of the invention may calibrate a part of the switch capacitor groups of the analog-to-digital converter, wherein in the calibration method, the compensation charge quantity is provided by using another part of the switch capacitor groups, and the calibration charge quantity of a part of the switch capacitor groups is recorded in the lookup table, such that the analog-to-digital converter may refer to the lookup table for performing compensation when executing the binary search operation. Therefore, the analog-to-digital converter according to the embodiments of the invention is capable of effectively calibrating capacitance mismatch without other calibration circuits or complicated coding setting.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
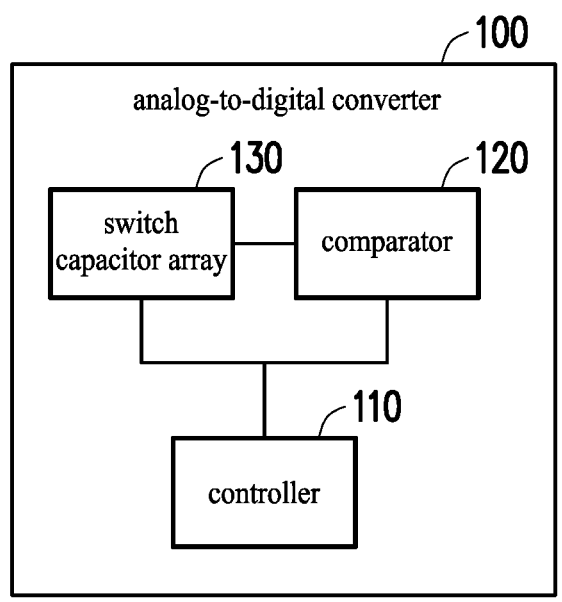
FIG. 1 is a block diagram of an analog-to-digital converter according to an embodiment of the invention.

In order to make the invention more comprehensible, embodiments are described below as examples to demonstrate that the invention can actually be realized. Moreover, elements/components/steps with the same reference numerals represent identical or similar parts in the drawings and embodiments wherever possible.

FIG. 1 is a block diagram of an analog-to-digital converter according to an embodiment of the invention. Referring to FIG. 1, the analog-to-digital converter 100 includes a controller 110, a comparator 120, and a switch capacitor array 130. The controller 110 is coupled to the comparator 120 and the switch capacitor array 130, and the comparator 120 is coupled to the switch capacitor array 130. The switch capacitor array 130 may include a plurality of switch capacitor groups, and the switch capacitor array 130 may be a digital-to-analog converter (DAC). In this embodiment, the analog-to-digital converter 100 may be a successive approximation register (SAR) analog-to-digital converter (ADC). The analog-to-digital converter 100 may be configured to execute a binary search operation according to a binary search algorithm, so as to perform conversion of an analog signal to a digital signal.

In this embodiment, the analog-to-digital converter 100 may create a lookup table (LUT) by pre-calibration, which is to be read by the controller 110 according to a switch state of the switch capacitor array 130 when the analog-to-digital converter 100 performs analog-to-digital conversion, so as to calibrate a charge quantity that the switch capacitor array 130 provides to the comparator 120 by a corresponding compensation charge quantity recorded in the lookup table. Thus, the comparator 120 of this embodiment is capable of outputting an accurate comparison result.

In this embodiment, the controller 110 may be a central processing unit (CPU), a programmable microprocessor for general or special purposes, a digital signal processor (DSP), a programmable controller, an application specific integrated circuit (ASIC), a programmable logic device (PLD), other similar processing circuits, or a combination of these devices, for example. The controller 110 may further include a storage device, wherein the storage device is a dynamic random access memory (DRAM), a flash memory, or a non-volatile random access memory (NVRAM), for example. In this embodiment, the storage device may be configured to store a plurality of modules and the lookup table described in each embodiment of the invention.

Figure 2:
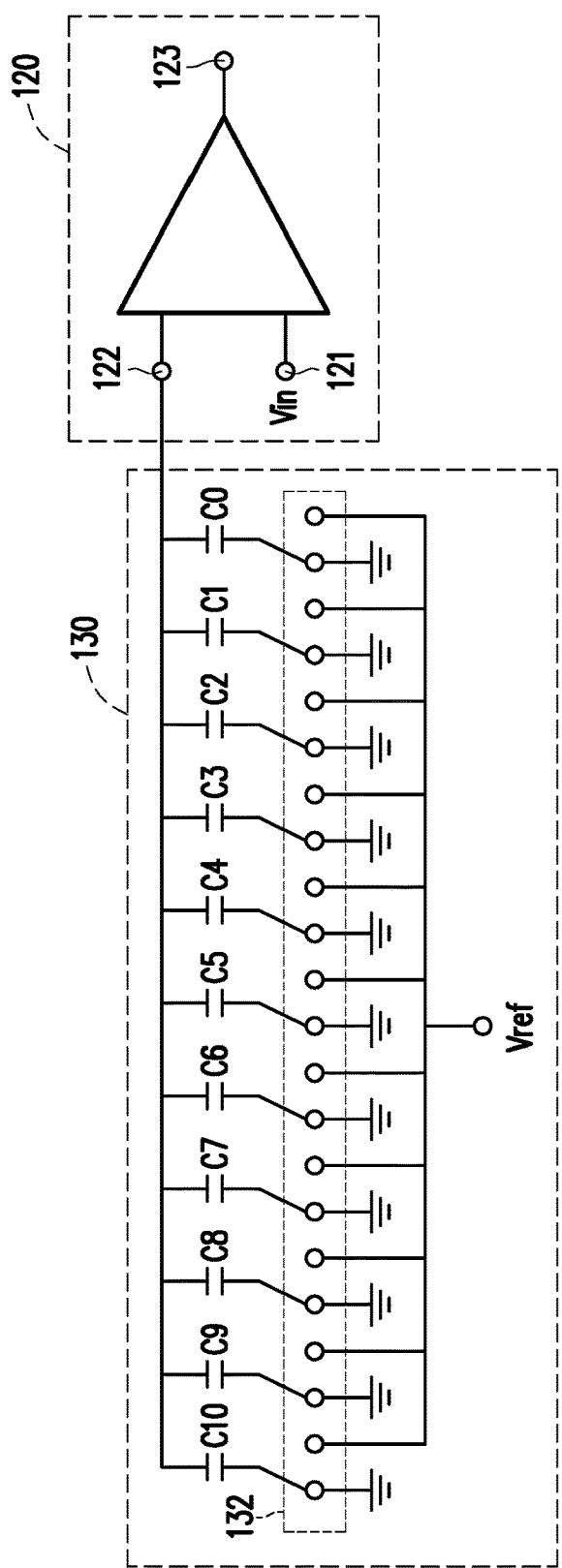
FIG. 2 is a schematic diagram of the analog-to-digital converter according to the embodiment of FIG. 1.

FIG. 2 is a schematic diagram of the analog-to-digital converter according to the embodiment of FIG. 1. Referring to FIG. 2, the comparator 120 is coupled to the switch capacitor array 130. The comparator 120 has a first input terminal 121, a second input terminal 122, and an output terminal 123. In this embodiment, the analog-to-digital converter 100 may be a 10-bit successive approximation register analog-to-digital converter, for example, but the invention is not limited thereto. In this embodiment, the switch capacitor array 130 includes a basic capacitor C0 and a plurality of switch capacitor groups C1 to C10 and a switch module 132. The basic capacitor C0 and the switch capacitor groups C1 to C10 are coupled to the switch module 132. In this embodiment, the basic capacitor C0 and the switch capacitor groups C1 to C10 are respectively composed of one or more capacitor units, and the switch capacitor groups C1 to C10 are arranged in the order of capacitances. In this embodiment, the basic capacitor C0 is configured to provide a unit capacitance, such that a total capacitance value of the switch capacitor array 130 is 1024 Coulomb (10-bit). In this embodiment, the switch capacitor group C1 is the least significant bit (LSB) and the switch capacitor group C10 is the most significant bit (MSB). In this embodiment, the basic capacitor C0 and the switch capacitor groups C1 to C10 are coupled in parallel to each other, and the basic capacitor C0 and the switch capacitor groups C1 to C10 are respectively coupled to a plurality of switch elements of the switch module 132. The controller 110 is coupled to the switch module 132 to control the switch elements, such that the basic capacitor C0 and the switch capacitor groups C1 to C10 selectively provide charges to the second input terminal 122 of the comparator 120.

However, the switch capacitor array 130 shown in FIG. 2 of this embodiment is an equivalent diagram. The specific circuit configuration and switch method of the basic capacitor C0 and the switch capacitor groups C1 to C10 of the switch capacitor array 130 of this embodiment can be understood by referring to the teaching, suggestion, and implementation illustration of the common knowledge in the field of successive approximation register analog-to-digital converters, and thus are not repeated hereinafter.

In this embodiment, one end of each of the switch elements of the switch module 132 receives a reference voltage Vref, and the controller 110 controls the switch elements of the switch module 132 to selectively provide the reference voltage Vref to the basic capacitor C0 and the switch capacitor groups C1 to C10, so as to selectively provide charges to the second input terminal 122 of the comparator 120 via the basic capacitor C0 and the switch capacitor groups C1 to C10. In this embodiment, the first input terminal 121 of the comparator 120 is configured to receive an input voltage Vin corresponding to a particular charge quantity. In this embodiment, the comparator 120 is configured to compare a voltage value received by the first input terminal 121 and a voltage value received by the second input terminal 122, and the comparator 120 outputs a voltage comparison result to the controller 110 via the output terminal 123.

Figure 3:
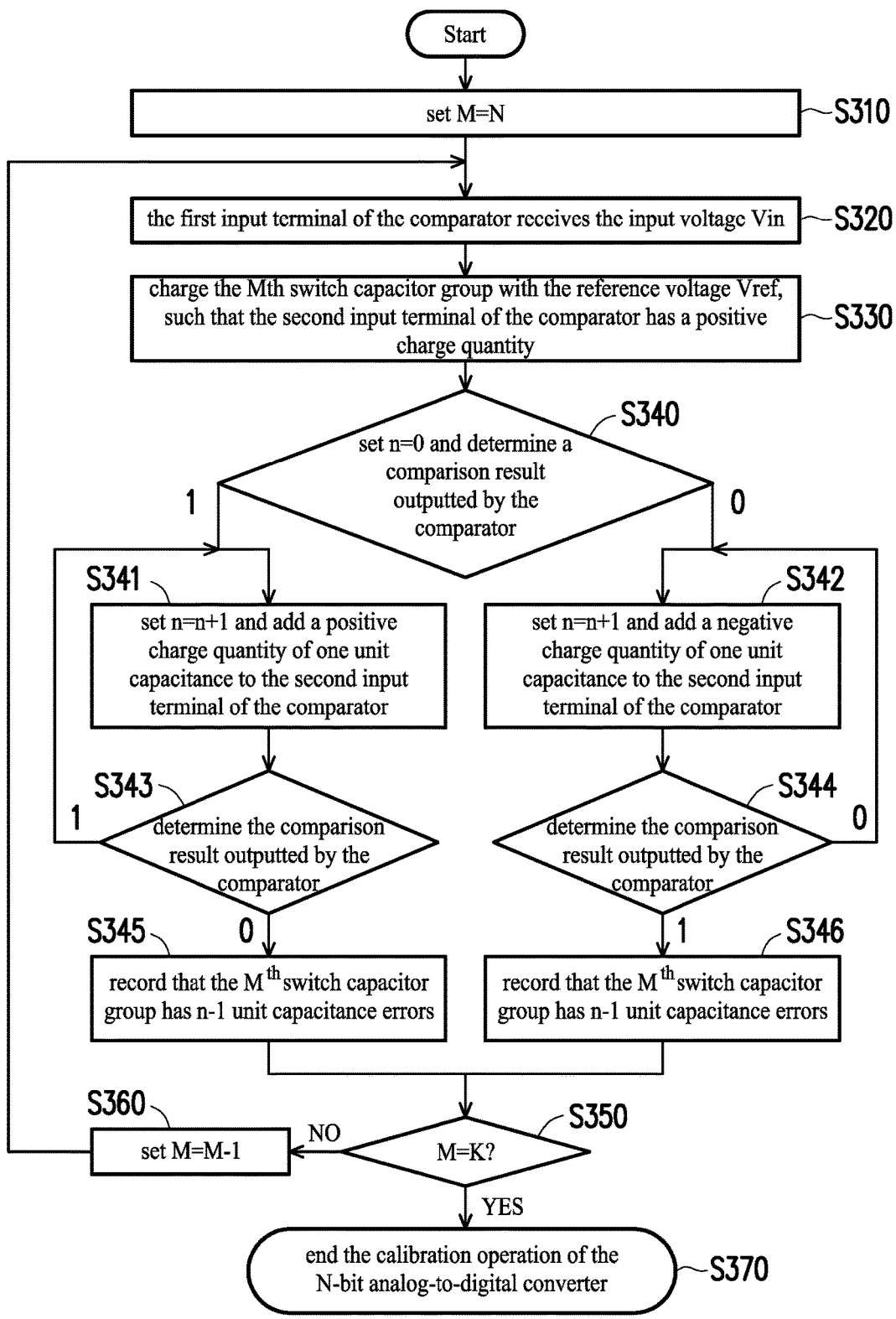
FIG. 3 is a flowchart of a calibration method according to an embodiment of the invention.

FIG. 3 is a flowchart of a calibration method according to an embodiment of the invention. Referring to FIG. 1, the calibration method of this embodiment is suitable at least for the analog-to-digital converter 100 of FIG. 1. In this embodiment, the analog-to-digital converter 100 is an N-bit successive approximation register analog-to-digital converter. It should be noted that, in this embodiment, the switch capacitor array 130 includes N switch capacitor groups, wherein the first switch capacitor group is the least significant bit (LSB) and the $N^{th}$ switch capacitor group is the most significant bit (MSB). In this embodiment, the controller 110 may take the first to the $K^{th}$ switch capacitor groups of the switch capacitor groups as compensation capacitors, and take the $(K+1)^{th}$ to the $N^{th}$ switch capacitor groups of the switch capacitor groups as capacitors to be calibrated. In this embodiment, the capacitance values of the first to the $K^{th}$ switch capacitor groups of the switch capacitor groups are lower than the capacitance values of the $(K+1)^{th}$ to the $N^{th}$ switch capacitor groups of the switch capacitor groups.

Specifically, in comparison with the capacitance mismatch of the switch capacitor group of low significant bit, the capacitance mismatch of the switch capacitor group of high significant bit has serious influence on the resolution of the analog-to-digital converter 100. Therefore, according to the invention, the switch capacitor group of low significant bit is taken as the compensation capacitor.

In Step S310, the controller 110 sets the parameters M=N, wherein the parameter M and the parameter N are positive integers greater than 0, and the parameter M is between 1 and N. In Step S320, the first input terminal of the comparator 120 receives the input voltage Vin, wherein the input voltage Vin satisfies the following Equation (1).

$$Vin = Vref \times (2^{(M-1)}) \div 2^N \quad \text{Equation (1)}$$

In Step S330, the controller 110 controls the switch capacitor array 130 to charge the $M^{th}$ switch capacitor group with the reference voltage Vref, such that the second input terminal of the comparator has a positive charge quantity. In Step S340, the controller 110 sets the parameter n=0, and determines a comparison result of the output terminal of the comparator 120. In this embodiment, if the comparison result outputted by the comparator 120 is 1, the controller 110 executes Step S341. If the comparison result outputted by the comparator 120 is 0, the controller 110 executes Step S342. That is, in this embodiment, the controller 110 decides whether the compensation charge quantity is a positive charge quantity or a negative charge quantity according to the comparison result of Step S340.

In Step S341, the controller 110 sets the parameter n=n+1, and operates the switch capacitor array 130 to further provide a positive charge quantity of one unit capacitance to the second input terminal of the comparator. In Step S343, the controller 110 determines the comparison result of the output terminal of the comparator 120. In this embodiment, if the comparison result outputted by the comparator 120 is 0, the controller 110 executes Step S345 to record that the $M^{th}$ switch capacitor group has n−1 unit capacitance errors, and executes Step S350. If the comparison result outputted by the comparator 120 is 1, the controller 110 re-executes Step S341.

In Step S342, the controller 110 sets the parameter n=n+1, and operates the switch capacitor array 130 to further provide a negative charge quantity of one unit capacitance to the second input terminal of the comparator. In Step S344, the controller 110 determines the comparison result of the output terminal of the comparator 120. In this embodiment, if the comparison result outputted by the comparator 120 is 1, the controller 110 executes Step S346 to record that the $M^{th}$ switch capacitor group has n−1 unit capacitance errors, and executes Step S350. If the comparison result outputted by the comparator 120 is 0, the controller 110 re-executes Step S342.

In Step S350, the controller 110 determines whether the parameter M is equal to K. In this embodiment, if the parameter M is not equal to K, the controller 110 sets the parameter M=M−1 and re-executes Step S320. If the parameter M is equal to K, the controller 110 executes Step S370 to end the calibration operation of the N-bit analog-to-digital converter.

Figure 4A:
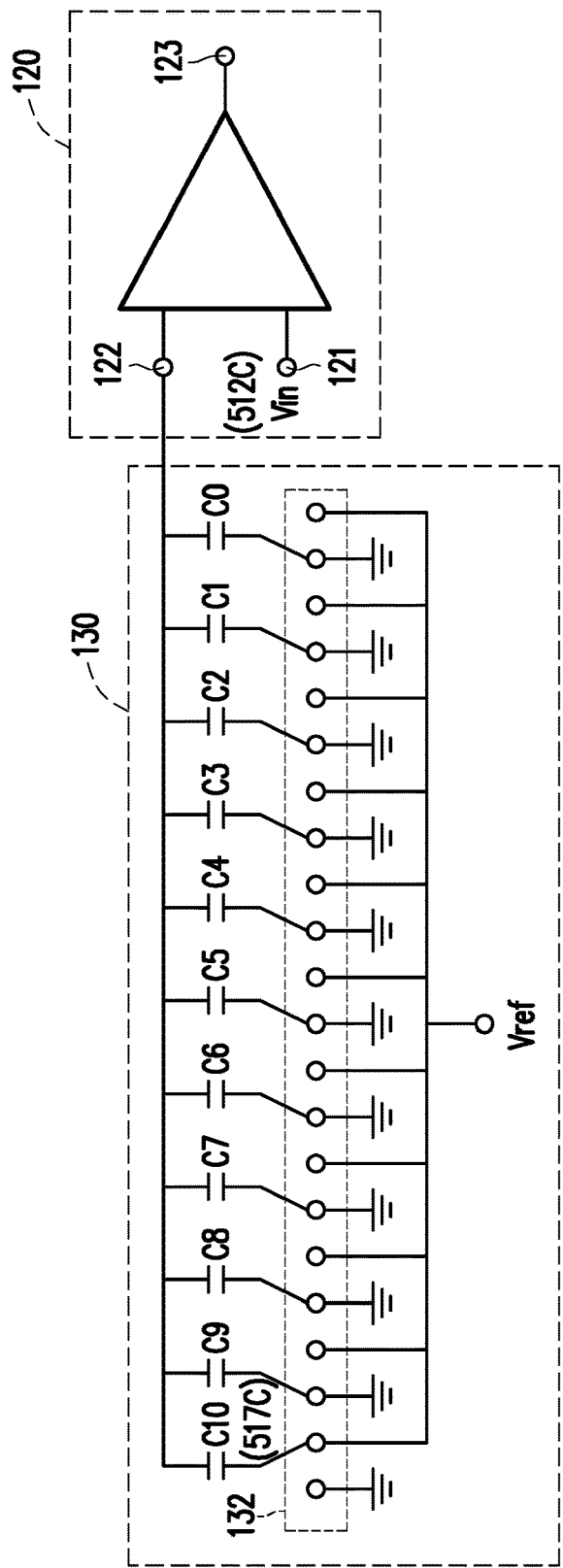
FIG. 4A to FIG. 4D are schematic diagrams showing switch of a switch capacitor array according to the embodiment of FIG. 2.

For example, FIG. 4A to FIG. 4D are schematic diagrams showing switch of the switch capacitor array according to the embodiment of FIG. 2. Referring to FIG. 4A to FIG. 4D, the following embodiment is described based on the 10-bit successive approximation register analog-to-digital converter shown in the embodiment of FIG. 2 as an example. In FIG. 4A, the basic capacitor C0 is 1C (Coulomb), and the capacitance values of the switch capacitor groups C1 to C10 are 1C, 2C, 4C, 8C, 16C, 32C, 67C, 125C, 256C, and 517C respectively, wherein the normal capacitance values of the switch capacitor groups C10, C8, and C7 should be 512C, 128C, and 64C. That is, in this example, the switch capacitor groups C10(517C), C8(125C), and C7(67C) have capacitance mismatch, which results in that an intermediate potential in the operation of the analog-to-digital converter 100 is 1029C/2=514.5C.

Regarding this, in this example, if the first input terminal 122 of the comparator 120 receives the input voltage Vin, the first input terminal 122 of the comparator 120 has a charge quantity of 513C. However, the expected output of the comparator 120 is "1000000001". Since the switch capacitor group C10(517C) has capacitance mismatch, the output of the comparator 120 becomes "0111111111". In addition, if the first input terminal 122 of the comparator 120 receives the input voltage Vin, the first input terminal 122 of the comparator 120 has a charge quantity of 514C. However, the expected output of the comparator 120 is "1000000010". Since the switch capacitor group C10(517C) has capacitance mismatch, the output of the comparator 120 is "0111111111" as well. In other words, the output of the comparator 120 is "0111111111" no matter the first input terminal 122 of the comparator 120 receives the charge quantity of 513C or 514C. In this example, the analog-to-digital converter 100 has a miss code.

Therefore, the analog-to-digital converter 100 of this embodiment solves the capacitance mismatch by executing the calibration method according to the embodiment of FIG. 3. In this embodiment, the first input terminal 121 of the comparator 120 receives the input voltage Vin, such that the first input terminal 121 of the comparator 120 has a charge quantity of 512C. First, referring to FIG. 4A, the controller 110 controls the switch module 132, such that the switch capacitor group C10(517C) provides charges to the second input terminal 122 of the comparator 120. Therefore, the second input terminal 122 of the comparator 120 has a charge quantity of about 514.5C ((517C/1029C)×1024C≈514.5C), and the corresponding voltage comparison result outputted by the output terminal of the comparator 120 is "0".

Figure 4B:
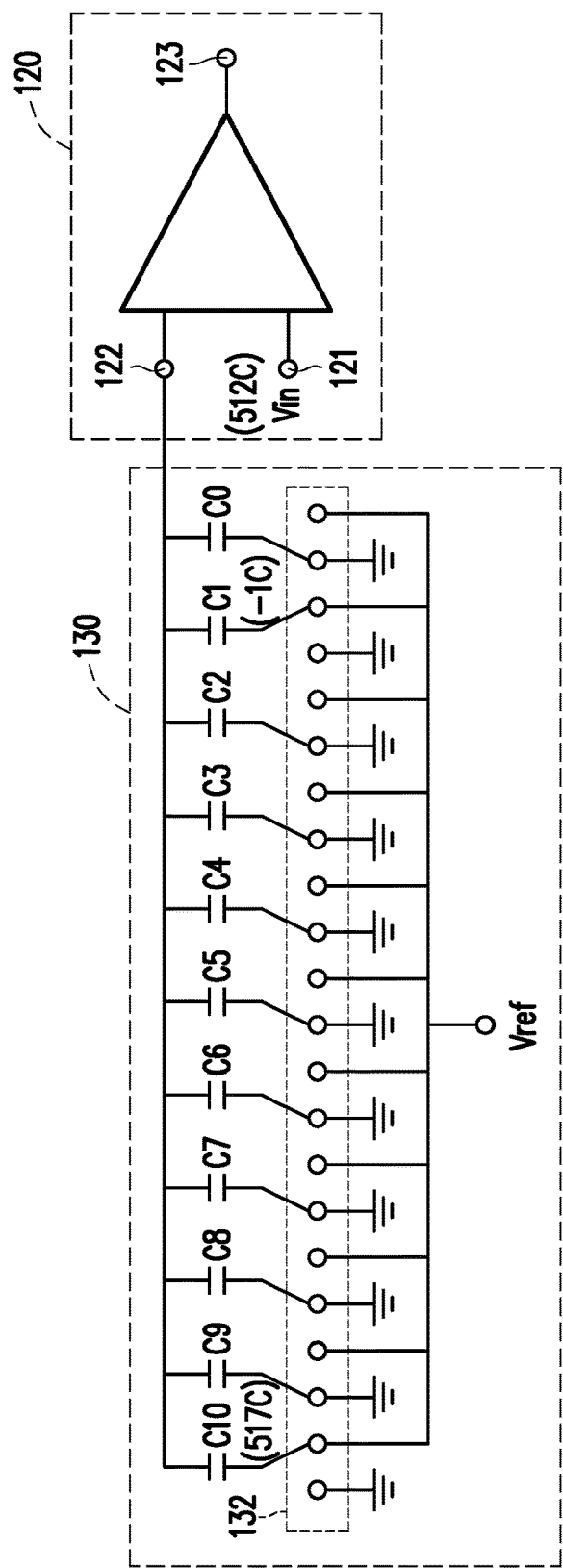

Then, referring to FIG. 4B, the controller 110 controls the switch module 132, such that the switch capacitor group C10(517C) and the switch capacitor group C1(−1C) provide charges to the second input terminal 122 of the comparator 120, wherein the compensation charge quantity is −1C. Therefore, the second input terminal 122 of the comparator 120 has a charge quantity of about 513.5C ((517C−1C/1029C)×1024C≈513.5C), and the corresponding voltage comparison result outputted by the output terminal of the comparator 120 is "0".

Figure 4C:
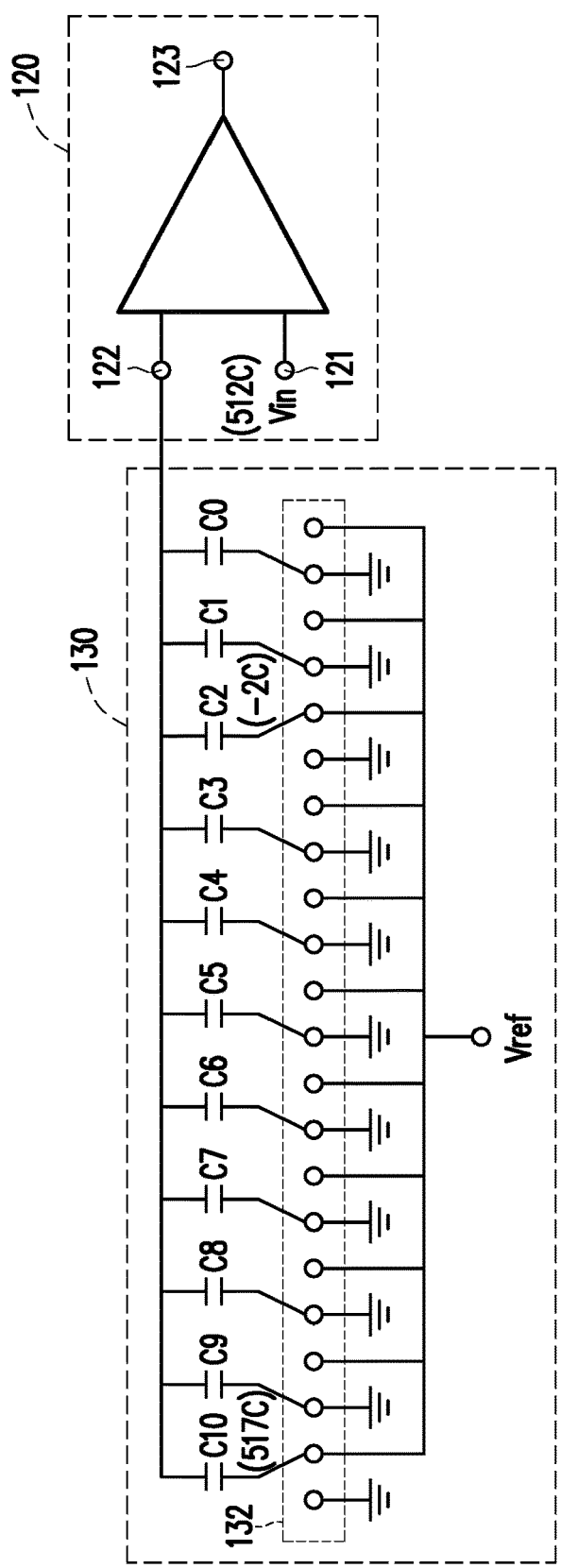

Thereafter, referring to FIG. 4C, the controller 110 controls the switch module 132, such that the switch capacitor group C10(517C) and the switch capacitor group C2(−2C) provide charges to the second input terminal 122 of the comparator 120, wherein the compensation charge quantity is −2C. Therefore, the second input terminal 122 of the comparator 120 has a charge quantity of about 512.5C ((517C−2C/1029C)×1024C≈512.5C), and the corresponding voltage comparison result outputted by the output terminal of the comparator 120 is "0".

Figure 4D:
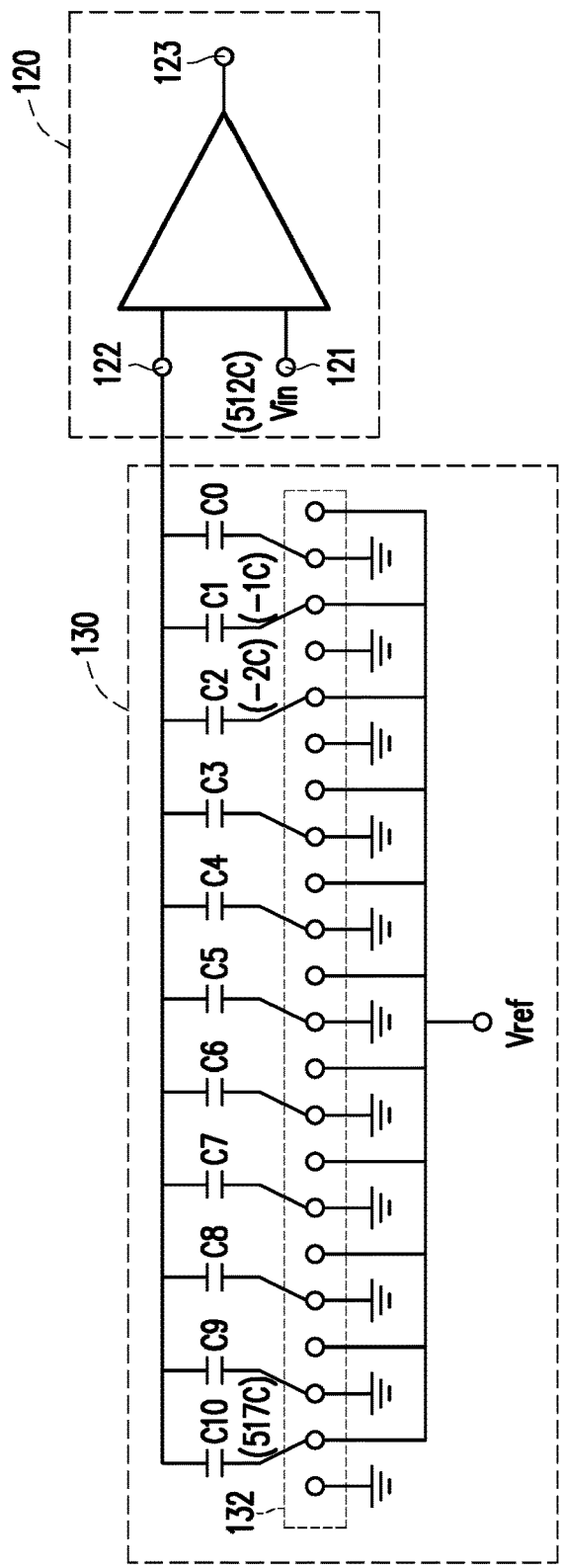

Then, referring to FIG. 4D, the controller 110 controls the switch module 132, such that the switch capacitor group C10(517C), the switch capacitor group C2(−2C), and the switch capacitor group C1 (−1C) provide charges to the second input terminal 122 of the comparator 120, wherein the compensation charge quantity is −3C. Therefore, the second input terminal 122 of the comparator 120 has a charge quantity of about 511.5C ((517C−3C/1029C)×1024C≈511.5C), and the corresponding voltage comparison result outputted by the output terminal of the comparator 120 is "1".

In this embodiment, the controller 110 determines that the charge quantity provided to the second input terminal 122 already approximates to the charge quantity provided to the first input terminal 121 based on the voltage comparison result (changing from 0 to 1) outputted by the comparator 120. Therefore, the analog-to-digital converter 100 records the calibration charge quantity in the lookup table stored by the controller via the controller 110, wherein the calibration charge quantity is equal to the current compensation charge quantity (−3C) plus the charge quantity provided by one unit capacitance (1C), so as to obtain the calibration charge quantity (−2C) of the switch capacitor group C10. In this embodiment, the analog-to-digital converter 100 may sequentially execute the switch operation described above on the seventh to the tenth switch capacitor groups C7 to C10 in the same manner as the switch capacitor group C10, for example, so as to create the lookup table as shown below (Table 1).

TABLE 1

| Switch Capacitor Group | Calibration Charge Quantity |
|---|---|
| C10(517 C) | −2 C |
| C9(256 C) | 0 C |
| C8(125 C) | +3 C |
| C7(67 C) | −2 C |

According to the above Table 1, since the switch capacitor groups C10, C8, and C7 have capacitance mismatch while the switch capacitor group C9 does not have capacitance mismatch, the controller 110 of this embodiment records the calibration charge quantities respectively corresponding to the switch capacitor groups C10, C9, C8, and C7 as −2C, 0C, +3C, and −2C. Thus, in this embodiment, the analog-to-digital converter 100 stores the lookup table (e.g., the above Table 1) in advance through the aforementioned calibration, and the controller 110 may adjust the turn-on states of the switch capacitor groups C7 to C10 correspondingly according to the calibration charge quantity recorded in the lookup table when the analog-to-digital converter 100 executes the binary search operation. Further, for example, if the charge quantity to be measured by the analog-to-digital converter 100 is the input voltage corresponding to 576C(512C+64C), the analog-to-digital converter 100 may adjust the switch result of the switch capacitor array 130 based on the calibration charge quantities ((−2C)+(−2C)=−4C) respectively corresponding to the switch capacitor groups C10 and C7 in the above Table 1, for the analog-to-digital converter 100 to accurately execute the binary search operation.

It should be noted that "the charge quantity of the second input terminal 122 approximates to the charge quantity provided to the first input terminal 121" mentioned in this embodiment means that the charge quantity of the second input terminal 122 is adjusted gradually by the difference of the unit capacitance (1C). However, the charge quantity of the second input terminal 122 after compensation may be the same as or different from the charge quantity of the first input terminal 121. Therefore, the controller 110 of this embodiment selects one compensation charge quantity that makes the charge quantity of the second input terminal 122 closest to or the same as the charge quantity of the first input terminal 121 to serve as the calibration charge quantity, such that the analog-to-digital converter 100 that has been calibrated is capable of accurately executing the binary search operation. In other words, according to the calibration method of the invention, the compensation charge quantity is constantly adjusted, so that the controller 110 determines the most appropriate compensation charge quantity, and whether the compensation charge quantity adjusted last time is the most appropriate compensation charge quantity is decided by whether the voltage comparison result outputted by the output terminal of the comparator 120 changes (from 1 to 0 or from 0 to 1).

Figure 5:
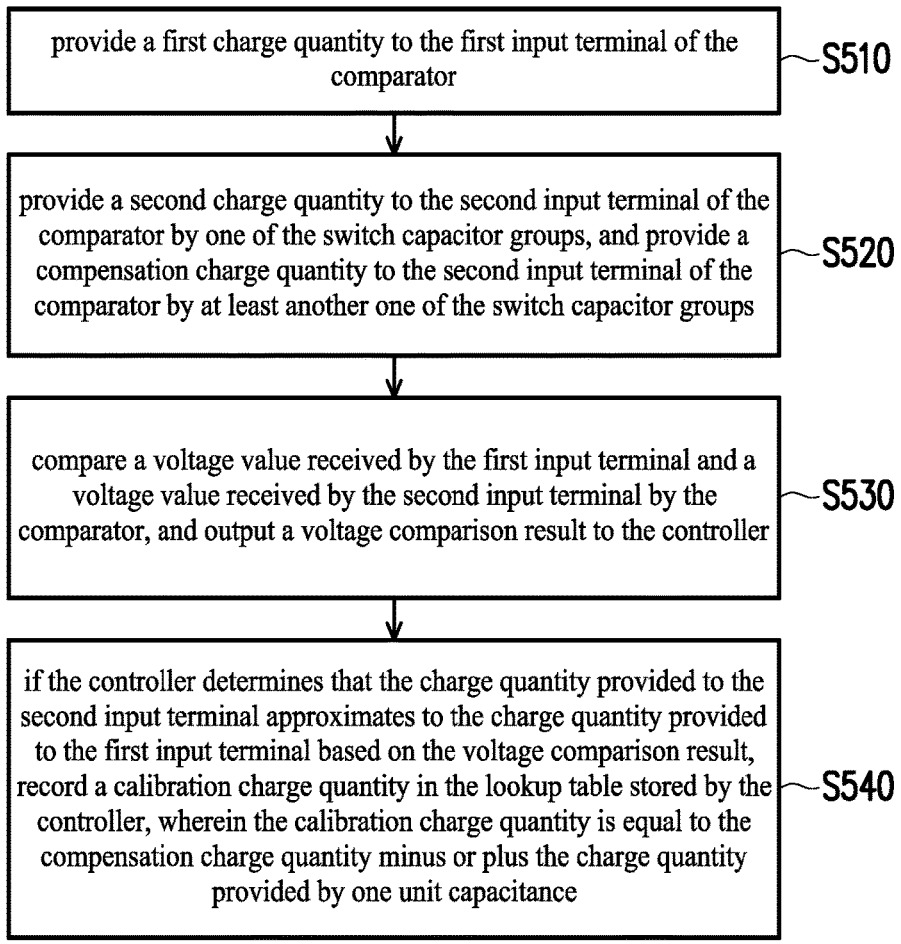
FIG. 5 is a flowchart of a calibration method according to another embodiment of the invention.

FIG. 5 is a flowchart of a calibration method according to another embodiment of the invention. Referring to FIG. 1, FIG. 2, and FIG. 5, the calibration method of this embodiment is suitable at least for the analog-to-digital converter 100 according to the embodiments of FIG. 1 and FIG. 2. In Step S510, the controller 110 provides a first charge quantity to the first input terminal 121 of the comparator 120. In Step S520, the controller 110 provides a second charge quantity to the second input terminal 122 of the comparator 120 by one of the switch capacitor groups C1 to C10, and provides a compensation charge quantity to the second input terminal 122 of the comparator 120 by at least another one of the switch capacitor groups C1 to C10. In Step S530, the controller 110 compares a voltage value received by the first input terminal 121 and a voltage value received by the second input terminal 122 by the comparator 120, and outputs a voltage comparison result to the controller 110. In Step S540, if the controller 110 determines that the charge quantity provided to the second input terminal 122 approximates to the charge quantity provided to the first input terminal 121 based on the voltage comparison result, the controller 110 records a calibration charge quantity in the lookup table stored by the controller 110, wherein the calibration charge quantity is equal to the compensation charge quantity minus or plus the charge quantity provided by one unit capacitance. Therefore, by the steps described above, the analog-to-digital converter 100 of this embodiment may record the calibration charge quantity corresponding to one of the switch capacitor groups C1 to C10 in the lookup table, such that the analog-to-digital converter 100 may adjust the turn-on states of the switch capacitor groups C1 to C10 correspondingly according to the calibration charge quantity recorded in the lookup table when executing the binary search operation.

In addition, other details regarding the analog-to-digital converter 100 of this embodiment and the calibration means can be understood by referring to the teaching, suggestion, and implementation illustration of the embodiments of FIG. 1 to FIG. 4D and thus are not repeated hereinafter.

Figure 6:
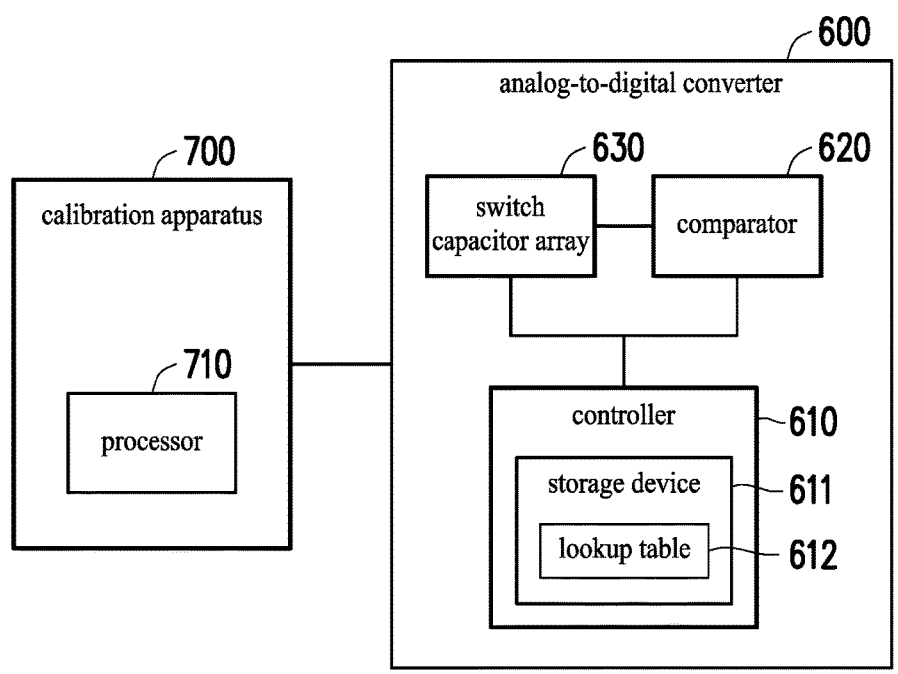
FIG. 6 is a block diagram of a calibration apparatus according to an embodiment of the invention.

FIG. 6 is a block diagram of a calibration apparatus according to an embodiment of the invention. Referring to FIG. 6, the calibration apparatus 700 of this embodiment may include a processor 710, wherein the processor 710 may be a central processing unit (CPU), a programmable microprocessor for general or special purposes, a digital signal processor (DSP), a programmable controller, an application specific integrated circuit (ASIC), a programmable logic device (PLD), other similar processing circuits, or a combination of these devices, for example. In this embodiment, the calibration apparatus 700 is coupled to an analog-to-digital converter 600.

In this embodiment, the analog-to-digital converter 600 includes a controller 610, a comparator 620, and a switch capacitor array 630. The controller 610 is coupled to the comparator 620 and the switch capacitor array 630, and the comparator 620 is coupled to the switch capacitor array 630. In this embodiment, the controller 610 includes a storage device 611, and the storage device 611 is configured to store a lookup table 612.

Specifically, in this embodiment, in the process of manufacturing the analog-to-digital converter 600, the analog-to-digital converter 600 may calibrate capacitance mismatch that may occur on the switch capacitor groups of the switch capacitor array 630 by the calibration apparatus 700. In this embodiment, the processor 710 of the calibration apparatus 700 is coupled to the analog-to-digital converter 600. The processor 710 is configured to drive the controller 610 to execute a calibration operation, such that a first input terminal of the comparator 620 receives a first charge quantity. The controller 610 operates the switch capacitor groups of the switch capacitor array 630, so as to provide a second charge quantity to the second input terminal of the comparator 620 by one of the switch capacitor groups and provide a compensation charge quantity to the second input terminal of the comparator 620 by at least another one of the switch capacitor groups. In this embodiment, the comparator 620 compares a voltage value received by the first input terminal and a voltage value received by the second input terminal, and outputs a voltage comparison result to the controller 610. In this embodiment, if the controller 610 determines that the charge quantity provided to the second input terminal approximates to the charge quantity provided to the first input terminal based on the voltage comparison result, the controller 610 records a calibration charge quantity in the lookup table stored by the controller 610. In this embodiment, the calibration charge quantity is equal to the compensation charge quantity minus or plus the charge quantity provided by one unit capacitance. Therefore, the calibration apparatus 700 of this embodiment may effectively calibrate the switch capacitor groups of the switch capacitor array 630, such that the analog-to-digital converter 600 may adjust the turn-on states of the switch capacitor groups correspondingly according to the calibration charge quantity recorded in the lookup table when executing the binary search operation.

In addition, details regarding the analog-to-digital converter 600 and the calibration apparatus 700 of this embodiment and the calibration method can be understood by referring to the teaching, suggestion, and implementation illustration of the embodiments of FIG. 1 to FIG. 5 and thus are not repeated hereinafter.

To sum up, the analog-to-digital converter, the calibration method, and the calibration apparatus in the embodiments of the invention may calibrate capacitance mismatch that occurs on a part of the switch capacitor groups of the switch capacitor array. The analog-to-digital converter according to the embodiments of the invention stores the lookup table that records a plurality of calibration charge quantities respectively corresponding to a part of the switch capacitor groups through calibration, such that the analog-to-digital converter may perform compensation by the compensation charge quantity provided by another part of the switch capacitor groups by referring to the lookup table when executing the binary search operation. Therefore, the analog-to-digital converter, the calibration method, and the calibration apparatus according to the embodiments of the invention are capable of effectively calibrating capacitance mismatch and are convenient to use and involve lower costs.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A calibration method, adapted for an analog-to-digital converter, wherein the analog-to-digital converter comprises a controller, a comparator, and a switch capacitor array, and the switch capacitor array comprises a plurality of switch capacitor groups, wherein the calibration method comprising:

providing a first charge quantity to a first input terminal of the comparator;

providing a second charge quantity to a second input terminal of the comparator by one of the switch capacitor groups, and providing a compensation charge quantity to the second input terminal of the comparator by at least another one of the switch capacitor groups;

comparing a voltage value received by the first input terminal and a voltage value received by the second input terminal by the comparator, and outputting a voltage comparison result to the controller; and if the controller determines that a charge quantity provided to the second input terminal approximates to a charge quantity provided to the first input terminal based on the voltage comparison result, recording a calibration charge quantity in a lookup table stored by the controller, wherein the calibration charge quantity is equal to the compensation charge quantity minus or plus a charge quantity provided by a unit capacitance.

2. The calibration method according to claim 1, wherein comparing the voltage value received by the first input terminal and the voltage value received by the second input terminal by the comparator, and outputting the voltage comparison result to the controller comprises:

providing the second charge quantity to the second input terminal of the comparator by one of the switch capacitor groups, such that the comparator compares a voltage value corresponding to the first charge quantity and a voltage value corresponding to the second charge quantity to output a first comparison result;

providing the second charge quantity to the second input terminal of the comparator by one of the switch capacitor groups, and simultaneously providing the compensation charge quantity to the second input terminal of the comparator by at least another one of the switch capacitor groups, such that the comparator compares the voltage value corresponding to the first charge quantity and the voltage value corresponding to the second charge quantity plus the compensation charge quantity to output a second comparison result; and determining whether the charge quantity provided to the second input terminal approximates to the charge quantity provided to the first input terminal based on the first comparison result and the second comparison result by the controller.

3. The calibration method according to claim 2, wherein determining whether the charge quantity provided to the second input terminal approximates to the charge quantity provided to the first input terminal based on the first comparison result and the second comparison result by the controller comprises:
if the first comparison result is different from the second comparison result, determining that the charge quantity provided to the second input terminal approximates to the charge quantity provided to the first input terminal; and
if the first comparison result is the same as the second comparison result, determining that the charge quantity provided to the second input terminal does not approximate to the charge quantity provided to the first input terminal.

4. The calibration method according to claim 2, further comprising:
deciding whether the compensation charge quantity is a positive charge quantity or a negative charge quantity based on the first comparison result.

5. The calibration method according to claim 1, wherein a capacitance value of one of the switch capacitor groups is higher than a capacitance value of at least another one of the switch capacitor groups.

6. The calibration method according to claim 1, wherein the analog-to-digital converter is a successive approximation register analog-to-digital converter.

7. The calibration method according to claim 1, further comprising:
when the analog-to-digital converter executes a binary search operation, if one of the switch capacitor groups is turned on, adjusting turn-on states of the switch capacitor groups correspondingly according to the calibration charge quantity recorded in the lookup table by the controller.

8. An analog-to-digital converter, comprising:
a controller;
a comparator, comprising a first input terminal, a second input terminal, and an output terminal, wherein the comparator is coupled to the controller; and
a switch capacitor array coupled to the controller and comprising a plurality of switch capacitor groups,
wherein the first input terminal of the comparator receives a first charge quantity, and the controller operates the switch capacitor groups, so as to provide a second charge quantity to the second input terminal of the comparator by one of the switch capacitor groups and provide a compensation charge quantity to the second input terminal of the comparator by at least another one of the switch capacitor groups,
wherein the comparator compares a voltage value received by the first input terminal and a voltage value received by the second input terminal, and outputs a voltage comparison result to the controller, and if the controller determines that a charge quantity provided to the second input terminal approximates to a charge quantity provided to the first input terminal based on the voltage comparison result, the controller records a calibration charge quantity in a lookup table stored by the controller, wherein the calibration charge quantity is equal to the compensation charge quantity minus or plus a charge quantity provided by a unit capacitance.

9. The analog-to-digital converter according to claim 8, wherein one of the switch capacitor groups provides the second charge quantity to the second input terminal of the comparator, such that the comparator compares a voltage value corresponding to the first charge quantity and a voltage value corresponding to the second charge quantity to output a first comparison result,
wherein one of the switch capacitor groups provides the second charge quantity to the second input terminal of the comparator, and at least another one of the switch capacitor groups simultaneously provides the compensation charge quantity to the second input terminal of the comparator, such that the comparator compares the voltage value corresponding to the first charge quantity and the voltage value corresponding to the second charge quantity plus the compensation charge quantity to output a second comparison result,
wherein the controller determines whether the charge quantity provided to the second input terminal approximates to the charge quantity provided to the first input terminal based on the first comparison result and the second comparison result.

10. The analog-to-digital converter according to claim 9, wherein if the first comparison result is different from the second comparison result, the controller determines that the charge quantity provided to the second input terminal approximates to the charge quantity provided to the first input terminal,
wherein if the first comparison result is the same as the second comparison result, the controller determines that the charge quantity provided to the second input terminal does not approximate to the charge quantity provided to the first input terminal.

11. The analog-to-digital converter according to claim 9, wherein the controller decides whether the compensation charge quantity is a positive charge quantity or a negative charge quantity based on the first comparison result.

12. The analog-to-digital converter according to claim 8, wherein a capacitance value of one of the switch capacitor groups is higher than a capacitance value of at least another one of the switch capacitor groups.

13. The analog-to-digital converter according to claim 8, wherein the analog-to-digital converter is a successive approximation register analog-to-digital converter.

14. The analog-to-digital converter according to claim 8, wherein when the analog-to-digital converter executes a binary search operation, if one of the switch capacitor groups is turned on, the controller adjusts turn-on states of the switch capacitor groups correspondingly according to the compensation charge quantity recorded in the lookup table.

15. A calibration apparatus, adapted for calibrating an analog-to-digital converter, wherein the analog-to-digital converter comprises a controller, a comparator, and a switch capacitor array, and the switch capacitor array comprises a plurality of switch capacitor groups, wherein the calibration apparatus comprising:
a processor coupled to the analog-to-digital converter and configured to drive the controller to execute a calibration operation, such that a first input terminal of the comparator receives a first charge quantity, and the controller operates the switch capacitor groups, so as to provide a second charge quantity to a second input terminal of the comparator by one of the switch capacitor groups and provide a compensation charge quantity to the second input terminal of the comparator by at least another one of the switch capacitor groups, wherein the comparator compares a voltage value received by the first input terminal and a voltage value received by the second input terminal, and outputs a voltage comparison result to the controller, and if the controller determines that a charge quantity provided to the second input terminal approximates to a charge quantity provided to the first input terminal based on the voltage comparison result, the controller records a calibration charge quantity in a lookup table stored by the controller, wherein the calibration charge quantity is equal to the compensation charge quantity minus or plus a charge quantity provided by a unit capacitance.

16. The calibration apparatus according to claim 15, wherein the processor drives the controller, such that the controller operates the switch capacitor groups, so as to provide the second charge quantity to the second input terminal of the comparator by one of the switch capacitor groups, for the comparator to compare a voltage value corresponding to the first charge quantity and a voltage value corresponding to the second charge quantity to output a first comparison result, wherein one of the switch capacitor groups provides the second charge quantity to the second input terminal of the comparator, and at least another one of the switch capacitor groups simultaneously provides the compensation charge quantity to the second input terminal of the comparator, such that the comparator compares the voltage value corresponding to the first charge quantity and the voltage value corresponding to the second charge quantity plus the compensation charge quantity to output a second comparison result, wherein the controller determines whether the charge quantity provided to the second input terminal approximates to the charge quantity provided to the first input terminal based on the first comparison result and the second comparison result.

17. The calibration apparatus according to claim 16, wherein if the first comparison result is different from the second comparison result, the controller determines that the charge quantity provided to the second input terminal approximates to the charge quantity provided to the first input terminal, wherein if the first comparison result is the same as the second comparison result, the controller determines that the charge quantity provided to the second input terminal does not approximate to the charge quantity provided to the first input terminal.

18. The calibration apparatus according to claim 16, wherein the controller decides whether the compensation charge quantity is a positive charge quantity or a negative charge quantity based on the first comparison result.

19. The calibration apparatus according to claim 15, wherein a capacitance value of one of the switch capacitor groups is higher than a capacitance value of at least another one of the switch capacitor groups.

20. The calibration apparatus according to claim 15, wherein the analog-to-digital converter is a successive approximation register analog-to-digital converter.

* * * * *